United States Patent [19]

Dass et al.

[11] Patent Number: 5,536,684
[45] Date of Patent: Jul. 16, 1996

[54] PROCESS FOR FORMATION OF EPITAXIAL COBALT SILICIDE AND SHALLOW JUNCTION OF SILICON

[75] Inventors: M. Lawrence A. Dass, Fremont; Peng Cheng, Campbell; David B. Fraser, Danville, all of Calif.

[73] Assignee: Intel Corporation, Santa Clara, Calif.

[21] Appl. No.: 269,440

[22] Filed: Jun. 30, 1994

[51] Int. Cl.⁶ .................................................. H01L 21/441
[52] U.S. Cl. .................. 437/201; 437/254; 148/DIG. 15; 148/DIG. 147; 148/DIG. 35
[58] Field of Search .................................. 437/196, 200, 437/950, 201, 954; 148/DIG. 15, DIG. 147, DIG. 35

[56] References Cited

U.S. PATENT DOCUMENTS

| | | | |
|---|---|---|---|
| 4,206,540 | 6/1980 | Gould . | |
| 4,378,628 | 4/1983 | Levinstein et al. . | |
| 4,398,344 | 8/1983 | Gould . | |
| 4,492,971 | 1/1985 | Bean et al. . | |
| 4,566,026 | 1/1986 | Lee et al. . | |
| 4,785,341 | 11/1988 | Ning et al. . | |
| 4,821,085 | 4/1989 | Haken et al. . | |
| 4,864,378 | 9/1989 | Tsaur . | |
| 4,914,500 | 4/1990 | Liu et al. | 437/912 |
| 4,926,237 | 5/1990 | Sun et al. . | |
| 4,931,353 | 6/1990 | Tanielian | 437/200 |
| 5,047,367 | 9/1991 | Wei et al. | 437/200 |
| 5,061,983 | 10/1991 | Egawa et al. . | |
| 5,183,773 | 2/1993 | Miyata | 437/44 |
| 5,268,590 | 12/1993 | Pfiester et al. | 257/764 |
| 5,278,096 | 1/1994 | Lee et al. | 437/193 |
| 5,356,837 | 10/1994 | Geiss et al. | 437/200 |

FOREIGN PATENT DOCUMENTS

| | | | |
|---|---|---|---|
| 0298109 | 12/1987 | Japan . | |
| 1-112755 | 5/1989 | Japan . | |
| 1-238144 | 9/1989 | Japan | 148/DIG. 147 |
| 3-41762 | 2/1991 | Japan . | |

OTHER PUBLICATIONS

H. Jiang et al., J. Electrochem. Soc., 139(1) (1992) 196 "Ultra Shallow Junction Formation Using Diffusion from Silicides".

S. Wolf & R. N. Tauber, "Silicon Processing for the VLSI Era" vol. I, 1986, pp. 57–58, 307–308, 325–326.

S. Wolf, "Silicon Processing for the VLSI ERA", vol. II, 1992, pp. 144–155.

E. Vetter et al, Phys. Stat. Sol. A98 (1986) K129, "Redistribution of implanted as in $MoSi_2$. . . ".

Lin, M. Z. & Wu, C. Y.; "Cobalt Silicide Interconnection from a Si/W/Co Trilayer Structure"; J. Electrochem. Soc.; vol. 136, No. 1; pp. 258–261; Jan. 1989.

Kaneko, et al.; "Novel Submicron MOS Devices by Self--Aligned Nitridation of Silicide (Sanicide)"; pp. 208–211; IEDM; 1985.

*Primary Examiner*—Tom Thomas
*Assistant Examiner*—Leon Radomsky
*Attorney, Agent, or Firm*—Blakely, Sokoloff, Taylor & Zafman

[57] ABSTRACT

A process for the formation of a planar epitaxial cobalt silicide and for the formation of shallow conformal junctions for use in semiconductor processing. A cobalt silicide and titanium nitride bilayer is formed. The titanium nitride layer is chemically removed. Ions with or without a dopant are then implanted into the cobalt silicide layer. During the ion implantation, at least a portion of the cobalt silicide layer is transformed into an amorphous cobalt silicon mixture while the non-amorphous portion remains single crystal. If the ion implantation contains dopants, then after the implantation is completed, both the amorphous and non-amorphous portions of the cobalt silicide layer contain the dopants. The substrate is then annealed in either an ambient comprising a nitrogen gas or in an oxidizing ambient. During the anneal, the amorphous portion of the silicon substrate recrystallizes into a single crystal cobalt silicide layer. If the cobalt silicide layer after the ion implantation contain dopants, then during the anneal the dopants are driven out of the cobalt silicide layer and diffuse into the silicon substrate to form a conformal shallow junction. The resulting structure can be used in the vertical integration of microelectronic devices. In other words, the resulting structure is suitable for growing selective epitaxial silicon, for growing epitaxial insulators, for processing devices above the silicide in that epitaxial silicon, and for processing devices with buried conductors.

36 Claims, 3 Drawing Sheets

PROCESS FOR FORMATION OF EPITAXIAL COBALT SILICIDE AND SHALLOW JUNCTION OF SILICON

BACKGROUND OF THE INVENTION

1. Field of the Invention

This invention relates to the field of semiconductor devices, and more specifically, to a process designed to form a planar epitaxial cobalt silicide ($CoSi_2$) suitable for vertical integration of microelectronic devices and for enabling the processing of devices with shallow junctions.

2. Prior Art

In the manufacture of semiconductor devices, the gate length of transistors must be scaled down for each new generation of integrated circuits (IC) in order to achieve higher speed and higher integration density. The source/drain junction depth of transistors must also be scaled down along with the gate length in order to reduce short channel effects. Currently, in a 0.41μ device, the source/drain junction depth must be less than angstroms for both NMOS and PMOS. According to constant field scaling, the source/drain junction depth for 0.25μ and 0.15μ devices will probably be less than 1250 and 750 angstroms, respectively.

As the source/drain junction depth decreases, the source/drain resistance increases significantly. This requires that a self-aligned silicide (salicide) process be used in order to reduce the source/drain resistance as well as gate resistance. In a salicide process a metal is deposited over an MOS structure, and reacts with the exposed silicon and polysilicon to form a silicide. The unreacted metal is then removed from the MOS structure by using a selective etch. In typical processes, the selective etch leaves the silicide over the source/drain regions and on the gates. Since the silicide remains in the desired regions without using a masking step, the process is thus self-aligned. One current process is the titanium (Ti) salicide process. However, as the source/drain junction decreases to below 2000 angstroms and eventually to 750 angstroms, the titanium silicide ($TiSi_2$) process can run into serious problems. Because the silicide thickness may be only several hundred angstroms in an ultra-shallow junction, the etch selectivity of $TiSi_2$ to borophosphosilicate glass (BPSG) may not be high enough for the $TiSi_2$ source/drain to withstand the contact etch. Another problem is that the titanium atoms form compounds with boron (B). This may make PMOS contact resistance very high. It is also very difficult to form shallow source/drain junctions by driving dopant out of $TiSi_2$. Dopants and $TiSi_2$ react to form compounds due to a strong chemical affinity between titanium and dopants. For example, the strong chemical affinity between titanium and boron forms the compound $TiB_2$ resulting in the depletion of the boron dopants. A similar reaction occurs between titanium and arsenic. All this makes it very difficult to achieve ultra-shallow junctions with $TiSi_2$.

Cobalt silicide ($CoSi_2$) is a very promising material for ultra-shallow junctions in future generation processes. The $CoSi_2$ has excellent etch selectivity to BPSG. Cobalt (Co) atoms do not form tightly bonded compounds with arsenic (As) and boron (B) atoms. Thus, $CoSi_2$ can be used as a doping source to achieve shallow junctions. Wei et. al., U.S. Pat. No. 5,047,367 assigned to Intel Corporation, demonstrates the formation of an epitaxial quality titanium nitride/cobalt silicide ($TiN/CoSi_2$) bilayer for use in salicide technology.

What is needed is a manufacturable method of forming ultra-shallow junctions compatible with the salicide technology described above. It is also preferred that any such method include the formation of a planar silicide layer suitable for vertical integration of microelectronic devices.

SUMMARY OF THE INVENTION

The present invention describes a process for forming an epitaxial silicide on a silicon substrate suitable for vertical integration of microelectronic devices and for enabling the processing of devices with shallow junctions.

The present invention describes a process wherein a refractory metal layer is deposited on a silicon substrate. On top of the refractory metal layer is deposited a group VIII metal layer. Then a first anneal is performed on the silicon substrate in an ambient comprising a nitrogen containing gas. During the first anneal a group VIII metal silicide layer is formed above the silicon substrate and a refractory metal nitride layer is formed above the group VIII metal silicide layer. After the first anneal is completed, the portion of the group VIII metal silicide layer is transformed into an amorphous group VIII metal silicon mixture. Finally, a second anneal is performed on the silicon substrate in a second ambient. During the second anneal an epitaxial group VIII metal silicide layer is formed.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

The present invention describes a process for forming a planar epitaxial cobalt silicide ($CoSi_2$) or other group VIII metal silicide suitable for vertical integration of microelectronic devices and for enabling the processing of devices with shallow junctions. In the following description, numerous specific details are set forth such as specific process steps, process parameters, materials, thicknesses, and etc., in order to provide a thorough understanding of the present invention. It will be obvious, however, to one skilled in the art, that the present invention may be practiced without these specific details. In other instances, well known process steps have not been described in detail in order not to unnecessarily obscure the present invention.

Figure 1:
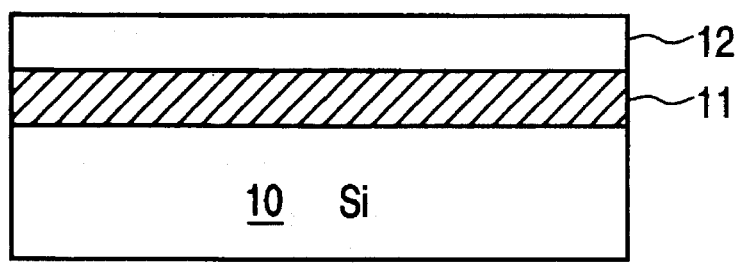
FIG. 1 is a cross-sectional elevation view of a silicon substrate with a titanium layer and a cobalt layer formed thereon.

The present invention incorporates a currently preferred process for forming an epitaxial quality titanium nitride/ cobalt silicide (TiN/CoSi$_2$) bilayer described in Wei et al., U.S. Pat. No. 5,047,367 assigned to the assignee of the present invention. FIG. 1 shows the surface of a silicon substrate 10 after deposition of a refractory metal layer 11 and a group VIII metal layer 12. In a currently preferred embodiment, refractory metal layer 11 is made of titanium and group VIII metal layer 12 is made of cobalt. Although the precise thicknesses are not critical and vary depending upon the depth of the junction to be formed, in a currently preferred embodiment the thickness of titanium layer 11 ranges from approximately 15 to 50 angstroms and the thickness of cobalt layer 12 ranges from approximately 50 to 150 angstroms. Also in a currently preferred embodiment, sputter deposition is used to deposit refractory metal layer 11 and group VIII metal layer 12. However, it will be obvious to one of ordinary skill in the art that other deposition methods may also be used, for example, evaporation of the metal to form the layers or chemical vapor deposition.

The substrate 10, with layers 11 and 12 thereon, is next processed through a first anneal step. In a currently preferred embodiment, the anneal will take place in a commercially available rapid thermal processing system (RTP) such as those manufactured by AG Associates or Peak Systems. However, it will be obvious to one with ordinary skill in the art that the anneal could be performed in a furnace with a suitable atmosphere. The parameters of the first anneal, such as the temperature and time, are designed to ensure that the formation of titanium nitride and cobalt silicide are complete, as described below in reference to FIGS. 2–4. In a currently preferred embodiment, the substrate is annealed in the RTP system for approximately 20 seconds at approximately 900 degrees C. in a nitrogen containing ambient. For example, the anneal may be performed in an ambient including nitrogen gas (N$_2$), ammonia (NH$_3$), or both. Alternatively, other nitrogen containing gases may be used. Also, the ambient may include other gases such as inert gases.

As can be seen from FIG. 1, titanium layer 11 is in direct contact with the silicon substrate 10 after the deposition. During the initial stages of the anneal, the titanium layer 11 is responsible for removing any native oxide, typically silicon dioxide (SiO$_2$), on the surface of silicon substrate 10. It is believed that this occurs as a result of the reaction of titanium and silicon dioxide (SiO$_2$) to form a titanium oxide (TiO$_x$) and an amorphous titanium/silicon mixture. The titanium oxide then travels to the surface along with the unreacted titanium and where the ambient is a reducing ambient, the oxygen is released into the ambient. This process will be described in greater detail below with reference to FIGS. 2–4. Any titanium remaining near the surface of substrate 10 from the amorphous titanium/silicon mixture is eventually silicidized to TiSi$_2$, which remains at the surface of silicon substrate 10. Generally, only a minor amount of titanium silicide is formed since a majority of the titanium reacts with the native oxide layer and travels to the surface.

The intermediate steps in the formation of the titanium nitride/cobalt silicide bilayer are discussed below with reference to FIGS. 2–4. The intermediate structures described have been determined by analyzing the film on silicon substrate 10 at various times during the annealing by well known prior art techniques such as Auger analysis, X-ray diffraction and transmission microscopy (TEM).

Figure 2:
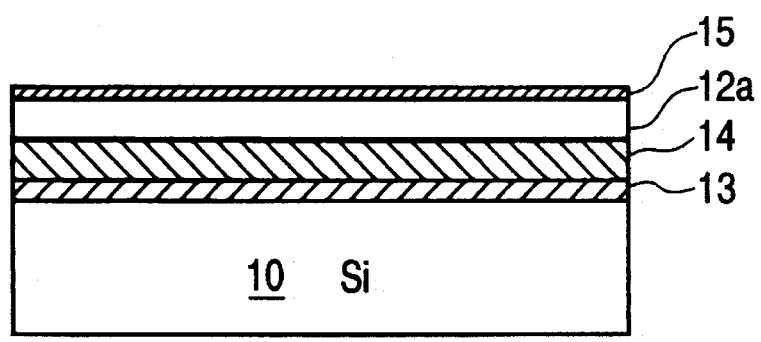
FIG. 2 is a cross-sectional view of the semiconductor body of FIG. 1 after a first anneal has proceeded for a short period of time.

FIG. 2 shows the structure of the deposited layers after the anneal has proceeded for a short period of time. Some titanium from titanium layer 11 of FIG. 1 has diffused up through the cobalt layer 12 to form a titanium layer 15 at the upper surface of the structure, disposed on the cobalt layer 12a, which is now slightly thinner than cobalt layer 12 of FIG. 1, due to downward diffusion of cobalt. Beneath layer 12a is layer 14, which is a mixture of titanium and cobalt. Disposed beneath layer 14 is layer 13, which is the initial cobalt silicide layer formed from the reaction of the cobalt, which has diffused downward, and the silicon on the surface of silicon substrate 10. Initially, layer 13 is not completely silicidized and is composed primarily of CoSi and CoSi$_2$.

Figure 3:
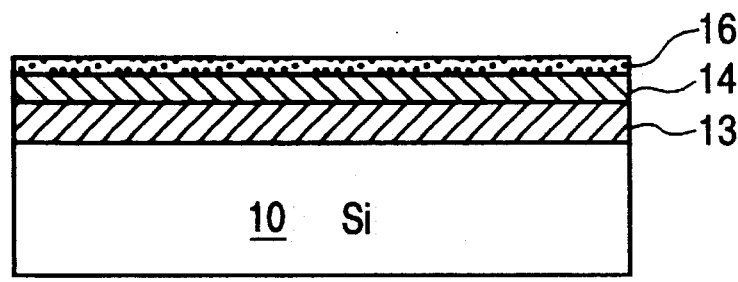
FIG. 3 is a cross-sectional view of the semiconductor body of FIG. 2 at a later time during the first anneal.

FIG. 3 shows that the titanium layer 15 from FIG. 2 has formed titanium nitride layer 16 by reacting with the nitrogen (N$_2$) or ammonia (NH$_3$) in the ambient. The remaining cobalt from cobalt layer 12a of FIG. 2 has now completely diffused downward into titanium/cobalt layer 14 and cobalt silicide layer 13.

Figure 4:
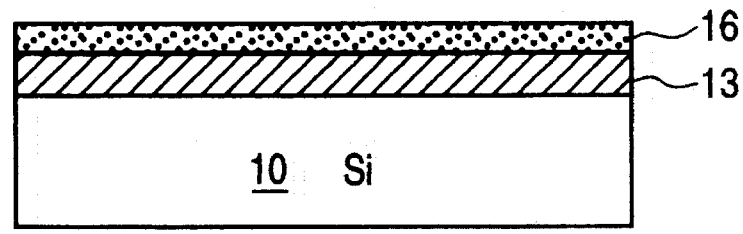
FIG. 4 is a cross-sectional elevation view of the semiconductor body of FIG. 3 after completion of the first anneal.

FIG. 4 shows the bilayer after the anneal step is completed. Cobalt silicide layer 13 (CoSi$_2$) is disposed on the surface of silicon substrate 10. Although the precise thickness is not critical and varies depending upon the depth of the junction to be formed, in a currently preferred embodiment, the thickness of cobalt silicide layer is approximately 550 angstroms. Titanium nitride layer 16 is disposed on top of cobalt silicide layer 13. Due to the nature of the cobalt silicide/titanium nitride interface energy and the nonuniform interdiffusion of the reactants, the titanium nitride layer does not contain smooth surface features at thicknesses greater than 50 angstroms. Hence, in the preferred embodiment, the cobalt silicide/titanium nitride interface (CoSi$_2$/TiN) is not planar since the titanium nitride layer 16 has a thickness of greater than 50 angstroms. The silicon/cobalt silicide interface (Si/CoSi$_2$) is extremely smooth.

Figure 5:
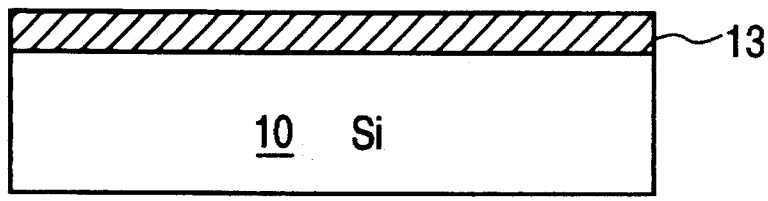
FIG. 5 is a cross-sectional elevation view of the semiconductor body of FIG. 4 after removal of the TiN layer.

FIG. 5 shows the cobalt silicide layer 13 disposed on top of the silicon substrate 10 after the titanium nitride layer 16 has been chemically removed. In a currently preferred embodiment, the titanium nitride layer 16 is removed from the top of cobalt silicide layer 13 by a 20 minute etch in a 1:2:1 solution of ammonium hydroxide, hydrogen peroxide, and water (NH4OH:H2O2:H2O). After the chemical etch the surface of the cobalt silicide layer 13 is not planar. The resulting rough surface of the cobalt silicide layer 13 is not well suited for selective silicon deposition. Also, the resulting rough surface of the cobalt silicide layer 13 will hinder the formation of conformal shallow junctions because ion implants would have varying surface thicknesses to penetrate in order to reach the silicon substrate 10.

Figure 6:
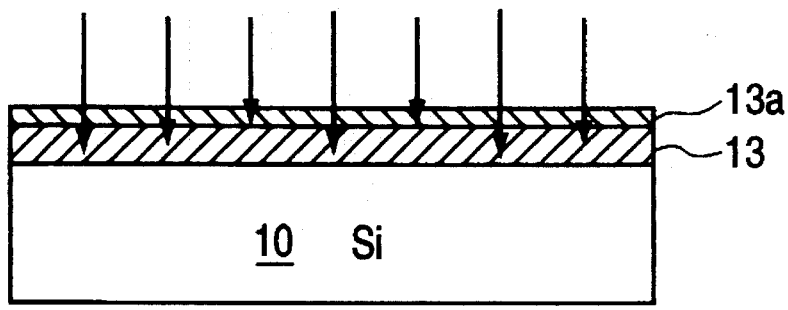
FIG. 6 is a cross-sectional view of the semiconductor body of FIG. 5 during ion implantation.

FIG. 6 shows the cobalt silicide layer 13 disposed on top of the silicon substrate during an ion implantation step. Ions are implanted into the cobalt silicide layer 13 with sufficient energy such that substantially all of the ions stay within the cobalt silicide layer 13 and only a few if any ion tails enter the silicon substrate 10. The energy and dose should be sufficient enough to amorphize at least a portion of the cobalt silicide layer 13. It should be noted that the wafer may be examined to be sure that at least a portion of the cobalt silicide layer 13 has been amorphized. In a currently preferred embodiment, the dose and energy of the silicon ions are on the order of $10^{15}$ cm$^{-2}$ and approximately 40–50 keV, respectively. Implanting the ions in this manner leaves the cobalt silicide/silicon interface (CoSi$_2$/Si) free of any implant damage thus retaining its smooth quality. In a currently preferred embodiment, silicon ions are used in the ion implantation step, however, it would be obvious to one with ordinary skill in the art that other ions may be used.

Figure 7:
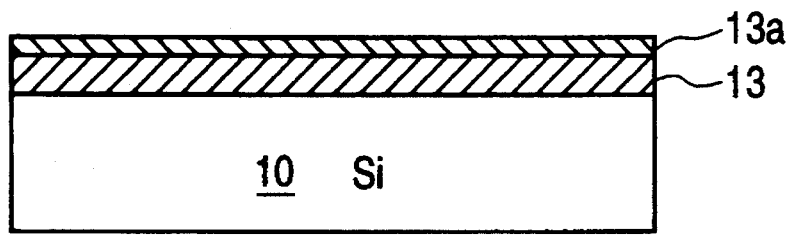
FIG. 7 is a cross-sectional elevation view of the semiconductor body of FIG. 6 after the ion implantation has been completed.

FIG. 7 shows the cobalt silicide layer 13 and the silicon substrate 10 after the ion implantation step is completed. The ion implantation transforms at least a portion of the cobalt silicide layer 13a into an amorphous cobalt silicide layer. The non-amorphized portion of cobalt silicide layer 13 still remains single crystal and is unchanged. Although the desired thickness of the amorphous cobalt silicide layer 13a is not critical, in a preferred embodiment only a portion of the cobalt silicide layer 13 is made amorphous. Alternatively, the entire layer may be amorphized.

The structure of FIG. 7 is next processed through a second anneal step. In a currently preferred embodiment, the anneal takes place in the same RTP system as the first anneal. The parameters of the second anneal such as the temperature and time are designed to ensure complete recrystallization of the cobalt silicide. In a currently preferred embodiment, the substrate is annealed in the RTP system for approximately 30 seconds at approximately 1000 degrees C. in a nitrogen containing ambient. For example, the anneal may be performed in an ambient including nitrogen gas (N$_2$), ammonia (NH$_3$), or both. Alternatively, other nitrogen containing gases may be used. Also, the ambient may include other gases such as inert gases in a nitrogen (N$_2$) or ammonium (NH$_3$) ambient. As a further alternative, the second anneal may be performed in an oxidizing ambient, such as an ambient including O$_2$, to prevent outdiffusion of the dopant.

Figure 8:
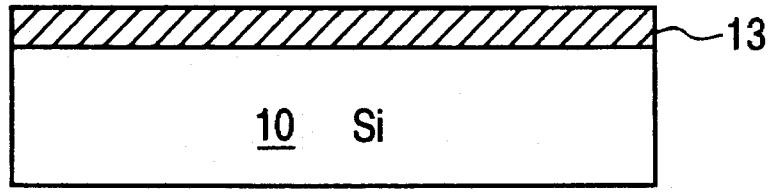
FIG. 8 is a cross-sectional view of the semiconductor body of FIG. 7 after a second anneal has been completed.

During the second anneal, the amorphous cobalt silicide layer 13a recrystallizes into cobalt silicide layer 13 free of any surface features. FIG. 8 shows the recrystallized cobalt silicide layer 13 disposed on top silicon substrate 10 after the anneal step is completed. The recrystallized cobalt silicide layer 13 has a single crystal structure with a planar surface morphology allowing vertical integration of microelectronic devices. In other words, the present invention forms a better epitaxial cobalt silicide layer suitable for growing selective epitaxial silicon, for growing epitaxial insulators (for example, CaF$_2$ or Al$_2$MgO$_4$), for processing devices above the silicide in that epitaxial silicon, and for processing devices with buried conductors (for example, an epitaxial silicon may be grown above the cobalt silicide layer such that the cobalt silicide layer may be used as a buried conductor).

Figure 9:
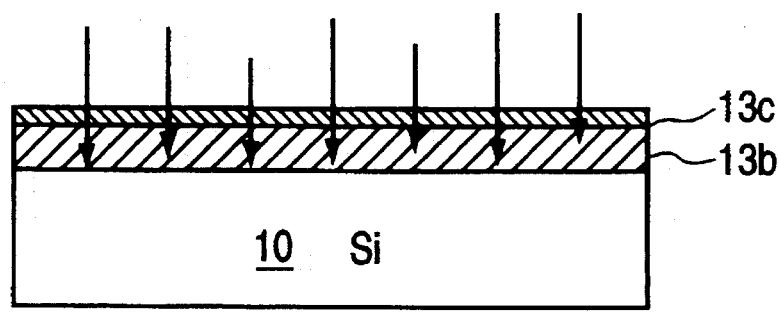
FIG. 9 is a cross-sectional view of the semiconductor body of FIG. 5 during ion implantation, where the ion implants contain a dopant.

In addition to forming a planar surface morphology suitable for silicon deposition the present invention can also be used to form conformal shallow junctions. Alternatively to FIG. 6, FIG. 9 shows the cobalt silicide layer 13 disposed on top of the silicon substrate during an ion implantation step containing dopant ions. The dopant ions are implanted into the cobalt silicide layer 13 with sufficient energy such that substantially all of the ions and dopants stay within the cobalt silicide layer 13 and only a few if any ion tails enter the silicon substrate 10. The energy and dose should be sufficient enough to amorphize at least a portion of the cobalt silicide layer 13, as described above. Implanting the cobalt silicide layer 13 in this manner confines all the implant damage in the silicide layer leaving the cobalt silicide/silicon interface (CoSi$_2$/Si) free of any implant damage and thus retaining its smooth quality. In a currently preferred embodiment silicon implants, arsenic (As) and boron fluoride (BF$_2$) dopants are used in the ion implantation step. The dose and energy of the dopants used may vary depending upon the depth of the junction desired. It should be noted that the dose and energies may typically range from approximately 5×10$^{14}$ to 1×10$^{15}$ cm$^{-2}$ and approximately 3.5 to 50 keV, respectively. In a currently preferred embodiment, the arsenic dopant has dose and energy of 8×10$^{15}$ cm$^{-2}$ and 50 keV, respectively, and the boron fluoride dopant has dose and energy of 8×10$^{15}$ cm$^{-2}$ and 45 keV, respectively.

Figure 10:
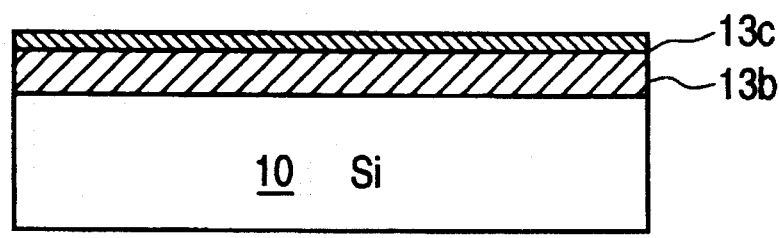
FIG. 10 is a cross-sectional elevation view of the semiconductor body of FIG. 9 after the ion implantation has been completed.

FIG. 10 shows the cobalt silicide layer 13 and the silicon substrate after the ion implantation containing dopants is completed. The ion implantation transforms at least a portion of the cobalt silicide layer 13c into an amorphous cobalt silicide layer with dopant. The non-amorphized portion of the cobalt silicide layer 13b still remains single crystal but also contains dopants. Although the desired thickness of the amorphous cobalt silicide layer 13a is not critical, in a preferred embodiment only a portion of the cobalt silicide layer 13 is made amorphous. Alternatively, the entire layer may be amorphized.

The dopants are then driven out of the cobalt silicide layer to form a conformal shallow junction by processing the substrates through a second anneal step. In a currently preferred embodiment, the anneal will take place in the same RTP system as the first anneal. The parameters of the second anneal such as the temperature and time are designated to ensure complete recrystalization of the cobalt silicide and to successfully drive the dopants out of the cobalt silicide layer and diffuse them into the substrate. In a currently preferred embodiment, the substrates are annealed in the RTP system for approximately 30 seconds at approximately 1000 degrees C. in a nitrogen containing ambient. For example, the anneal may be performed in an ambient including nitrogen gas (N$_2$), ammonia (NH$_3$), or both. Alternatively, other nitrogen containing gases may be used. Also, the ambient may include other gases such as inert gases in a nitrogen (N$_2$) or ammonium (NH$_3$) ambient. As a further alternative, the second anneal may be performed in an oxidizing ambient, such as an ambient including O$_2$, to prevent out diffusion of the dopants.

Figure 11:
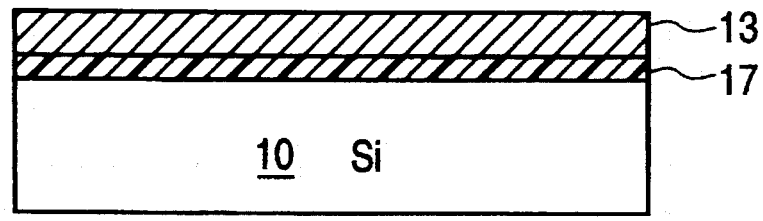
FIG. 11 is a cross-sectional view of the semiconductor body of FIG. 10 after a second anneal has been completed.

During the second anneal, the amorphous cobalt silicide layer 13c recrystallizes into crystalline cobalt silicide layer 13 free of any surface features and the dopants are driven out of the cobalt silicide layer and diffuse into the silicon substrate to form a conformal shallow junction. Since the silicide/silicon interface does not suffer any implant damage and is left planar in the present invention, the dopants are driven the same distance into the substrate thus making the shallow junctions conformal. In other words, the dopants all enter the silicon substrate at the same level allowing them to diffuse the same distance into the substrate, thereby creating a conformal junction. FIG. 11 shows the recrystallized cobalt silicide layer 13 disposed on top of the shallow conformal junction 17 formed in the silicon substrate 10 after the anneal step is completed. In a currently preferred embodiment, shallow junctions approximately 0.1µ in depth have been formed. However, by adjusting the appropriate parameters, junctions as shallow as 0.01µ may be formed using the present invention. One advantage to forming conformal shallow junctions with the present invention is that the silicide/silicon interface is free of any implant damage which results in superior electrical qualities. Furthermore, prior art processes, such as ion implantation, have a tendency to punch through further into the substrate when making shallow junctions due to the stress between junctions, so that the shallow junctions formed using such a process are not conformal. The present invention avoids the problem of punchthrough by implanting the ions into the silicide layer and then diffusing them into the substrate allowing greater control over the depth of the junction.

An additional advantage of the present invention over the prior art is that the cobalt silicide layer 13 is single crystalline which has lower resistance qualities and remains stable at higher temperatures than prior art polycrystalline silicides.

Thus, a process for forming planar epitaxial cobalt silicide suitable for vertical integration of microelectronic devices and enable processing devices with shallow junctions is described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A process for forming an epitaxial silicide on a silicon substrate comprising the steps of:
    depositing on said silicon substrate a first layer comprising a refractory metal;
    depositing on said first layer a second layer comprising a group VIII metal;
    performing a first anneal on said silicon substrate in a first ambient comprising a nitrogen containing gas to form a group VIII metal silicide layer disposed above said silicon substrate and a refractory metal nitride layer disposed above said group VIII metal silicide layer;
    removing said refractory metal nitride layer, wherein said refractory metal nitride layer is removed after performing said first anneal and before forming an amorphous portion of said group VIII metal silicide layer;
    forming said amorphous portion of said group VIII metal silicide layer;
    performing a second anneal on said silicon substrate in a second ambient to form an epitaxial group VIII metal silicide layer.

2. The process as described in claim 1 wherein said refractory metal comprises titanium and said refractory metal nitride comprises titanium nitride.

3. The process as described in claim 1 wherein said group VIII metal comprises cobalt and said group VIII metal silicide comprises cobalt silicide.

4. The process as described in claim 1 wherein said first ambient comprises a gas selected from the group consisting of nitrogen and ammonia.

5. The process described in claim 1 wherein said second ambient comprises a nitrogen containing gas.

6. The process as described in claim 1 wherein said second ambient comprises an oxidizing ambient.

7. The process as described in claim 1 wherein said epitaxial group VIII metal silicide layer is of planar quality.

8. The process as described in claim 1 wherein said amorphous portion of said group VIII metal silicide layer is formed by performing an ion implantation into said group VIII metal silicide layer.

9. The process as described in claim 8 wherein said ion implantation comprises silicon ions.

10. The process as described in claim 8 wherein said ion implantation contains a dopant, said dopant diffusing through said group VIII metal silicide layer into said silicon substrate to form a conformal shallow junction.

11. A process for forming an epitaxial silicide on a silicon substrate comprising the steps of:
    depositing on said silicon substrate a first layer comprising a refractory metal;
    depositing on said first layer a second layer comprising a group VIII metal;
    performing a first anneal on said silicon substrate in a first ambient comprising a nitrogen containing gas to form a group VIII metal silicide layer disposed above said silicon substrate and a refractory metal nitride layer disposed above said group VIII metal silicide layer;
    removing said refractory metal nitride layer;
    forming an amorphous portion of said group VIII metal silicide layer;
    performing a second anneal on said silicon substrate in a second ambient to form an epitaxial group VIII metal silicide layer.

12. The process as described in claim 11 wherein said refractory metal comprises titanium and said refractory metal nitride comprises titanium nitride.

13. The process as described in claim 11 wherein said group VIII metal comprises cobalt and said group VIII metal silicide comprises cobalt silicide.

14. The process as described in claim 11 wherein said first ambient comprises a gas selected from the group consisting of nitrogen and ammonia.

15. The process described in claim 11 wherein said second ambient comprises a nitrogen containing gas.

16. The process as described in claim 11 wherein said second ambient comprises an oxidizing ambient.

17. The process as described in claim 11 wherein said epitaxial group VIII metal silicide layer is of planar quality.

18. The process as described in claim 11 wherein said amorphous portion of said group VIII metal silicide layer is formed by performing an ion implantation into said group VIII metal silicide layer.

19. The process as described in claim 18 wherein said ion implantation comprises silicon ions.

20. The process as described in claim 18 wherein said ion implantation contains a dopant, said dopant diffusing through said group VIII metal silicide layer into said silicon substrate to form a conformal shallow junction.

21. A process for forming a shallow junction on a silicon substrate comprising the steps of:
    forming a group VIII metal silicide and refractory metal nitride bilayer;
    removing said refractory metal nitride layer, wherein said refractory metal nitride layer is removed before forming an amorphous portion of said group VIII metal silicide layer;
    forming said amorphous portion of said group VIII metal silicide layer;
    performing an anneal on said silicon substrate in an ambient to form an epitaxial group VIII metal silicide layer.

22. The process as described in claim 21 wherein said refractory metal nitride comprises titanium nitride.

23. The process as described in claim 21 wherein said group VIII metal silicide comprises cobalt silicide.

24. The process described in claim 21 wherein said ambient comprises a nitrogen containing gas.

25. The process as described in claim 21 wherein said ambient comprises an oxidizing ambient.

26. The process as described in claim 21 wherein said epitaxial group VIII metal silicide layer is of planar quality.

27. The process as described in claim 21 wherein said amorphous portion of said group VIII metal silicide layer is formed by performing an ion implantation into said group VIII metal silicide layer.

28. The process as described in claim 27 wherein said ion implantation comprises silicon ions.

29. The process as described in claim 27 wherein said ion implantation contains a dopant, said dopant diffusing through said group VIII metal silicide layer into said silicon substrate to form a conformal shallow junction.

30. A process for forming a shallow junction on a silicon substrate comprising the steps of:

depositing on said silicon substrate a first layer comprising a refractory metal;

depositing on said first layer a second layer comprising a group VIII metal;

performing a first anneal on said silicon substrate in a first ambient comprising a nitrogen containing gas to form a group VIII metal silicide layer disposed above said silicon substrate and a refractory metal nitride layer disposed above said group VIII metal silicide layer;

removing said refractory metal nitride layer;

performing an ion implantation to form an amorphous portion of said group VIII metal silicide layer wherein said ion implantation contains a dopant, said dopant diffusing through said group VIII metal silicide layer into said silicon substrate to form a conformal shallow junction;

performing a second anneal on said silicon substrate in a second ambient to form an epitaxial group VIII metal silicide layer.

31. The process as described in claim 30 wherein said refractory metal comprises titanium and said refractory metal nitride comprises titanium nitride.

32. The process as described in claim 30 wherein said group VIII metal comprises cobalt and said group VIII metal silicide comprises cobalt silicide.

33. The process as described in claim 30 wherein said first ambient comprises a gas selected from the group consisting of nitrogen and ammonia.

34. The process described in claim 30 wherein said second ambient comprises a nitrogen containing gas.

35. The process as described in claim 30 wherein said second ambient comprises an oxidizing ambient.

36. The process as described in claim 30 wherein said ion implantation comprises implanting a dopant selected from the group consisting of arsenic and boron.

* * * * *

UNITED STATES PATENT AND TRADEMARK OFFICE
CERTIFICATE OF CORRECTION

PATENT NO.   : 5,536,684
DATED        : July 16, 1996
INVENTOR(S)  : Dass et al.

It is certified that error appears in the above-identified patent and that said Letters Patent is hereby corrected as shown below:

On the title page, in the third line of the title in section [54], delete "JUNCTION OF SILICON" and substitute --JUNCTION ON SILICON--

In column 1, at line 3, delete "JUNCTION OF SILICON" and substitute --JUNCTION ON SILICON--

In column 1, at line 20, delete "0.41μ" and substitute --0.4μ--

In column 1, at line 21, insert --2000-- between "than" and "angstroms"

In column 1, at line 42, delete "ultra:shallow" and substitute --ultra-shallow--

In column 5, at line 38, insert --of the-- between "top" and "silicon substrate"

In column 6, at line 9, delete "cm$^{31\ 2}$" and substitute --cm$^{-2}$--

In column 7, at line 51, delete "ammonia," and substitute --ammonia.--

Signed and Sealed this

Twelfth Day of November, 1996

Attest:

BRUCE LEHMAN

*Attesting Officer*   *Commissioner of Patents and Trademarks*